(12) United States Patent
Juengling

(10) Patent No.: US 7,282,401 B2  
(45) Date of Patent: Oct. 16, 2007

(54) METHOD AND APPARATUS FOR A SELF-ALIGNED RECESSED ACCESS DEVICE (RAD) TRANSISTOR GATE

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/177,850

(22) Filed: Jul. 8, 2005

(65) Prior Publication Data

US 2007/0010058 A1 Jan. 11, 2007

(51) Int. Cl.  
*H01L 21/8238* (2006.01)

(52) U.S. Cl. ............... 438/203; 257/330; 257/332; 257/401; 438/241; 438/242; 438/266; 438/275; 438/279; 438/316; 438/322

(58) Field of Classification Search ........... 257/330, 257/332, 401; 438/241, 242, 266, 275, 279, 438/316, 322  
See application file for complete search history.

(56) References Cited

U.S. PATENT DOCUMENTS

| | | | |
|---|---|---|---|
| 4,835,741 A | 5/1989 | Baglee | 365/185.1 |
| 4,979,004 A | 12/1990 | Esquivel et al. | 257/316 |
| 5,281,548 A | 1/1994 | Prall | 438/259 |
| 5,392,237 A | 2/1995 | Iida | 365/185.16 |
| 5,472,893 A | 12/1995 | Iida | 438/259 |
| 6,184,086 B1 | 2/2001 | Kao | 438/259 |
| 6,916,711 B2 * | 7/2005 | Yoo | 438/259 |
| 2004/0070028 A1 * | 4/2004 | Azam et al. | 257/330 |
| 2005/0042833 A1 * | 2/2005 | Park et al. | 438/282 |

OTHER PUBLICATIONS

"Methods Of Forming Recessed Access Devices Associated With Semiconductor Constructions", Parekh et al., US Patent Application filed Mar. 25, 2005, U.S. Appl. No. 11/090,529.

* cited by examiner

Primary Examiner—Thao P. Le

(57) ABSTRACT

A method used in fabrication of a recessed access device transistor gate has increased tolerance for mask misalignment. One embodiment of the invention comprises forming a vertical spacing layer over a semiconductor wafer, then etching the vertical spacing layer and the semiconductor wafer to form a recess in the wafer. A conductive transistor gate layer is then formed within the trench and over the vertical spacing layer. The transistor gate layer is etched, which exposes the vertical spacing layer. A spacer layer is formed over the etched conductive gate layer and over the vertical spacing layer, then the spacer layer and the vertical spacing layer are anisotropically etched. Subsequent to anisotropically etching the vertical spacing layer, a portion of the vertical spacing layer is interposed between the semiconductor wafer and the etched conductive transistor gate layer in a direction perpendicular to the plane of a major surface of the semiconductor wafer.

21 Claims, 9 Drawing Sheets

METHOD AND APPARATUS FOR A SELF-ALIGNED RECESSED ACCESS DEVICE (RAD) TRANSISTOR GATE

FIELD OF THE INVENTION

This invention relates to the field of semiconductor manufacture and, more particularly, to a method used in the formation of a recessed access device (RAD) transistor gate, and a structure for a RAD transistor gate.

BACKGROUND OF THE INVENTION

Manufacture of various semiconductor devices such as memory devices, logic devices, and microprocessors has the common goal of miniaturization. As feature sizes decrease, the electrical operation of the transistor becomes more difficult. One contributing factor to this difficulty is known as the "short channel effect" in which the width of the transistor channel becomes excessively small due to miniaturization. This may result in the transistor activating even though a threshold voltage ($V_t$) has not been applied to the gate.

One type of transistor which has been developed to overcome the short channel effect of a conventional transistor by forming a wider channel in the same horizontal space is referred to as a "recessed access device" or "RAD" transistor. One type of RAD transistor comprises a transistor gate (word line) which is partially formed within a trench in a semiconductor wafer. The channel region is formed along the entire surface of the trench which, in effect, provides a wider channel without increasing the lateral space required by the transistor.

A conventional method to form an n-channel metal oxide semiconductor (NMOS) RAD transistor is depicted in FIGS. 1-6. FIG. 1 depicts a semiconductor wafer 10 having a region 12 which is doped with n-type dopants, a pad oxide (pad dielectric) 14 which protects the wafer 10 from a patterned mask 16, which is typically photoresist. An anisotropic etch is performed on the FIG. 1 structure to form the trench 20 within the wafer 10 as depicted in FIG. 2. The transistor channel 22 is formed within the wafer along the trench, and results from a conductively doped region within the wafer.

After forming the FIG. 2 structure, the photoresist 16 and the pad oxide 14 are removed and a transistor gate oxide layer 30 is formed over the exposed semiconductor wafer 10. Next, various blanket transistor gate layers are formed as depicted in FIG. 3, such as a doped polysilicon layer 32, a silicide layer 34, and a nitride capping layer 36. A patterned photoresist layer 38 is formed which will be used to define the transistor gate. The FIG. 3 structure is anisotropically etched down to the gate oxide, and the photoresist layer 38 is removed to result in the transistor gate of FIG. 4 which comprises layers 32, 34, and 36. A blanket spacer layer 50, for example silicon nitride, is formed over the structure of FIG. 4 to result in the FIG. 5 structure, and a spacer etch is then performed to form insulative spacers 60 around the transistor gate as depicted in FIG. 6, and to complete the transistor gate. In the structure of FIG. 6, implanted regions 12 represent transistor source/drain regions, although other implanting steps may be performed which are not immediately germane to the present invention.

The structure of FIGS. 1-6 is formed using an ideal process. A not-infrequent problem with semiconductor device formation, particularly with decreasing feature sizes, is misalignment of a photoresist mask. This may result in the process and structure depicted in FIGS. 7-10. FIG. 7 comprises a structure analogous to FIG. 3 wherein the mask 38 of FIG. 3 has been misaligned to result in mask 70 of FIG. 7.

After forming the FIG. 7 structure, capping nitride layer 36, silicide layer 34, and polysilicon layer 32 are etched to result in the defined gate of FIG. 8. This etch, because of the misalignment of the mask 70, removes a portion of the polysilicon layer 32 from the trench along trench portion 80 and exposes the channel region 22 as depicted.

Wafer processing continues according to the method of FIGS. 1-6 to form spacer layer 50 as depicted in FIG. 9, then a spacer etch is performed to result the device of FIG. 10 comprising insulative spacers 60.

The transistor of FIG. 10 will have poor electrical operation and may even be nonfunctional. The application of the threshold voltage across the transistor requires adequate electrical communication between the gate (layers 32 and 34) and each of the channel region 22 and the source/drain regions 12. As depicted in FIG. 6, the gate overlies the entire channel region 22 and also the source/drain region 12 on each side of the channel 22. As depicted in FIG. 10, however, the gate 32, 34 does not overlie either of region 80 of the channel 22 or the source/drain region 12 on the left side of the gate. Further, the nitride spacer 60 has a portion interposed between gate layer 32 and region 80 of the channel 22. This electrical insulator between the gate and the channel, along with the increased distance between gate layer 32 and portion 80 of channel 22, decreases electrical coupling between the channel portion 80 and gate layer 32.

A method for forming a RAD transistor gate and a resulting RAD transistor which has more robust tolerance for mask misalignment over conventional processing would be desirable.

SUMMARY OF THE INVENTION

The present invention provides a new method which, among other advantages, reduces problems associated with the manufacture of semiconductor devices, particularly problems resulting from mask misalignment during the formation of a recessed access device (RAD) transistor. In accordance with one embodiment of the invention a pad oxide layer and a dielectric vertical spacing layer are formed over a semiconductor wafer substrate assembly comprising a semiconductor wafer, then a trench or opening is etched into the wafer through an opening in the vertical spacing layer. The wafer exposed at the trench is implanted to form a channel region, and a gate oxide is provided within the trench. Next, blanket gate layers, such as a doped polysilicon layer, a silicide layer, and a capping layer are formed, with at least the polysilicon layer formed partially within the trench, and all the gate layers formed over the vertical spacing layer.

Next, the capping layer, the silicide layer, and the polysilicon layer are masked with a patterned photoresist layer, which will be used to pattern the transistor gate. This embodiment of the present invention provides for additional misalignment tolerance of this mask, which defines the transistor gate. The exposed portions of the capping layer, the silicide layer, and the polysilicon layer are overetched just far enough to ensure removal of the polysilicon layer from over the vertical spacing layer. During this etch, a portion of the vertical spacing layer which is exposed is partially etched, and prevents removal of the polysilicon layer from within the trench.

An implant may be performed to adjust the source/drain regions. Subsequently, a blanket conformal spacer layer is formed over the transistor gate and over the vertical spacing layer, then a vertical etch is performed to expose the semiconductor wafer. Wafer processing then continues as is known in the art to complete the semiconductor device.

Advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but may be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

Figure 11:
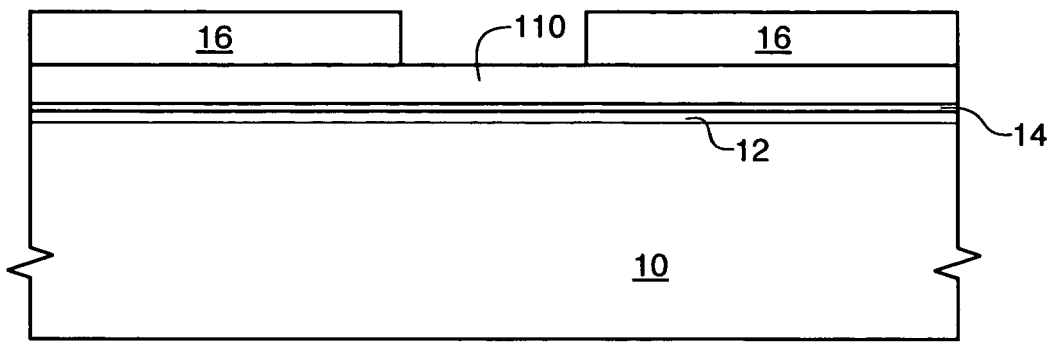
FIGS. 11-16 are cross sections depicting an embodiment of the present invention used to form a RAD transistor, wherein a misaligned mask is used to pattern the transistor gate stack.

A first embodiment of an inventive method used to form a recessed access device (RAD) transistor is depicted in FIGS. 11-16. FIG. 11 depicts a semiconductor wafer 10 having a region 12 comprising n-type dopants. FIG. 11 further depicts pad oxide (pad dielectric) 14 and a vertical spacing layer 110. Pad oxide 14 protects against contamination, provides stress relief between the wafer 10 and the vertical spacing layer 110, and functions as an etch stop layer during an etch of vertical spacing layer 110. The vertical spacing layer 110 may comprise any dielectric such as, by way of example only, silicon dioxide or silicon nitride. With present device sizes, the vertical spacing layer will be between about 100 Å and about 500 Å thick, and its thickness will depend on an overetch of the gate (polysilicon overetch) discussed below. FIG. 11 further depicts a patterned mask 16, such as photoresist, which is used to define a trench in wafer 10. After forming the FIG. 11 structure, an anisotropic etch is performed to form a trench 20 within the wafer 10, then the mask layer 16 is removed to result in the structure of FIG. 12. A conductively doped channel region 22 may result from previous ion implantation into the wafer, or the wafer along the trench may be implanted subsequent to trench formation.

Figure 12:
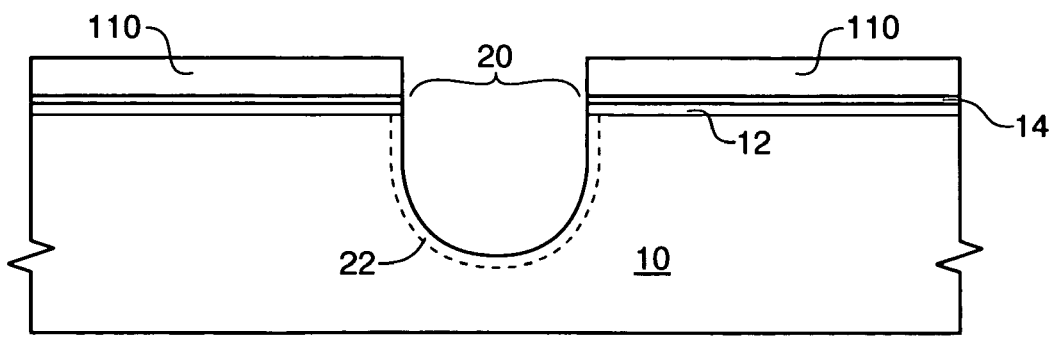
Figure 13:
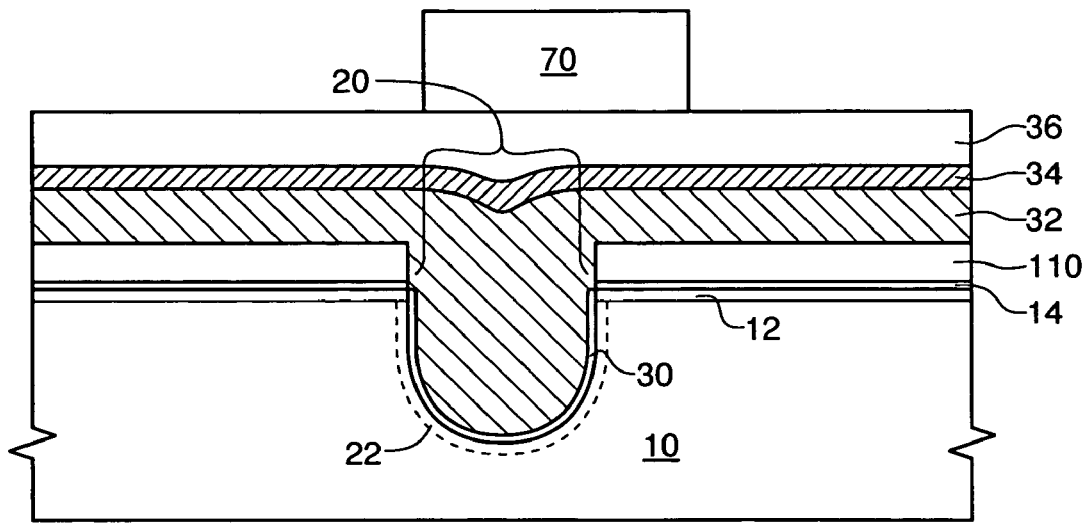

After forming the FIG. 12 structure, a transistor gate oxide layer is grown on the exposed semiconductor wafer according to techniques known in the art to result in the gate oxide 30 of FIG. 13. Next, various blanket transistor gate layers are formed, such as a doped polysilicon layer 32, a silicide layer 34, and a nitride capping layer 36. A patterned photoresist layer 70 is formed which will be used to define the transistor gate. While mask 70 is intended to be centered over the trench 20, mask 70 has been misaligned due to variations in the masking process.

Figure 14:
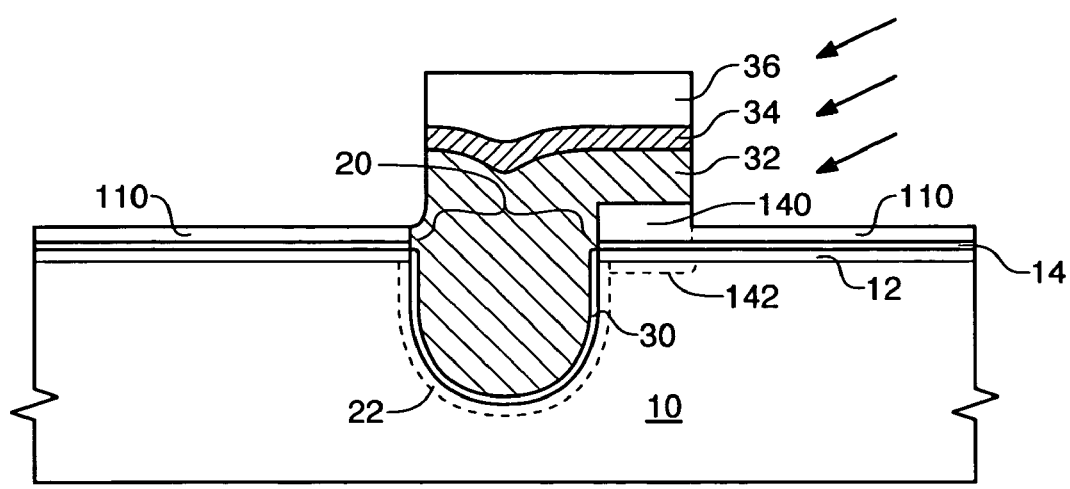
Figure 15:
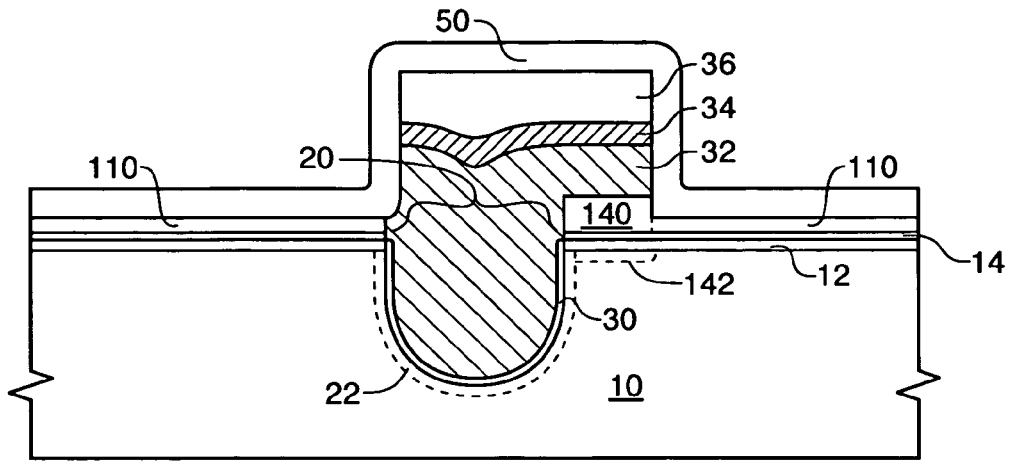

The FIG. 13 structure is anisotropically etched to remove all exposed gate layers down to the vertical spacing layer 110, then the mask 70 is removed to result in the FIG. 14 structure. The etch of the FIG. 13 structure is preferably performed using an etch which removes polysilicon 32 and vertical spacing layer 110 at about the same rate. For a vertical spacing layer 110 formed from either silicon dioxide or silicon nitride, an etchant comprising tetrafluoromethane ($CF_4$) would result in sufficiently similar etch rates for the vertical spacing layer and the polysilicon gate layer. After completing the FIG. 14 structure, an implant is typically performed to enhance the source/drain regions 12.

The FIG. 14 structure also depicts the results of an intentional overetch of the polysilicon layer 32. This overetch partially etches the exposed portions of the vertical spacing layer, and ensures complete removal of the polysilicon layer 32 from over the vertical spacing layer 110. However, it is preferable that the overetch is terminated prior to etching completely through vertical spacing layer 110 so that none of polysilicon layer 32 is removed from within the trench 20 in the wafer 10. In this embodiment, an unetched portion 140 of layer 110 remains.

After forming the FIG. 14 structure, an optional angled implant (depicted by the arrows) into the semiconductor wafer 10 may be performed as depicted to more heavily dope the wafer, particularly into the wafer 10 at location 142 which is immediately under the unetched vertical spacing layer portion 140 which is interposed between the trench and the sidewall on the right-hand side of the transistor of FIG. 14. Implanting this region may be advantageous for electrical operation of the transistor if the mask 70 at FIG. 13 has been misaligned to such an excessive degree that the original wafer doping 12 at FIG. 11 does not provide sufficient electrical communication between the source/drain region 12 and the channel 22.

If the mask is not misaligned, an unetched portion of the vertical spacing layer similar to portion 140 will remain under each side of conductive transistor gate layer 32. That is, an unetched portion 140 of vertical spacing layer 110 will remain interposed between the trench and each vertically oriented transistor gate sidewall. In the FIG. 14 structure where mask misalignment has occurred, no unetched portion of vertical spacing layer 110 remains interposed between the trench and the transistor sidewall on the left side of the transistor gate as depicted.

Figure 16:
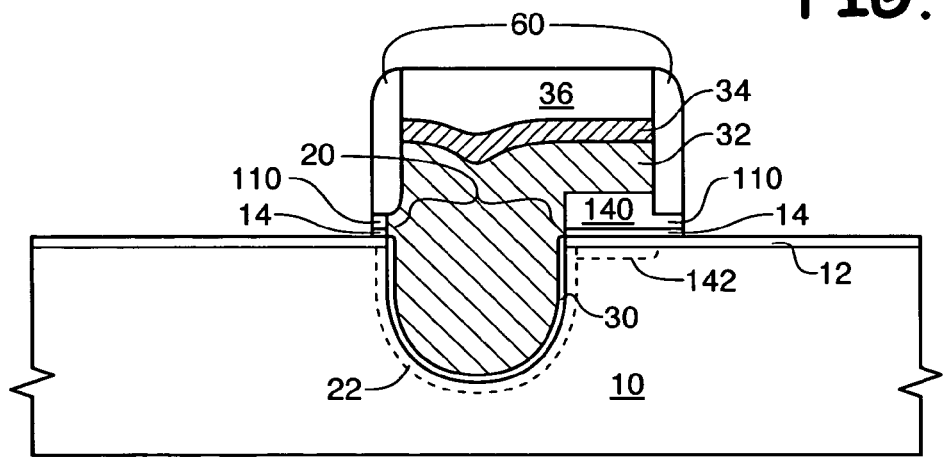

After completing the slight overetch of the gate to expose and etch into vertical spacing layer 110, vertically doping the source/drain regions 14, and completing any desired angled implants, a blanket spacer layer 50, for example silicon nitride, is formed over vertically oriented sidewalls of the conductive transistor gate layers 32, 34. Blanket spacer layer 50 is also formed over a horizontally oriented surface of the vertical spacing layer 110 of FIG. 14 to result in the FIG. 15 structure. Next, a spacer etch is performed to provide insulative spacers 60 around the conductive layers 32, 34 and the nonconductive layer 36 of the transistor gate as depicted in FIG. 16 to complete the transistor gate and the insulation layers surrounding the transistor gate. Wafer processing then continues according to techniques known in the art to form a completed semiconductor device.

Figure 1:
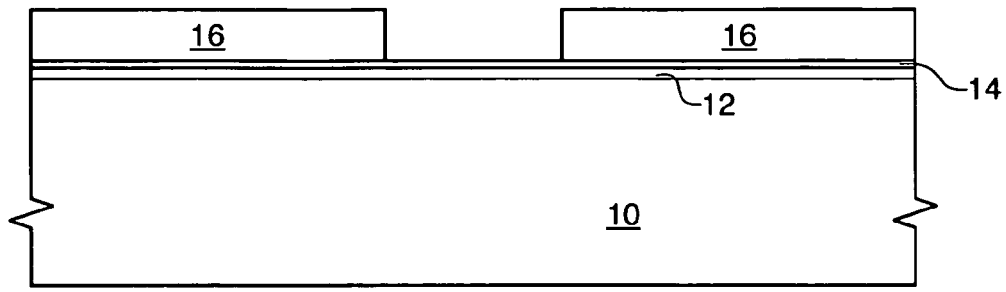
FIGS. 1-6 are cross sections depicting the conventional formation of a recessed access device (RAD) transistor.
Figure 2:
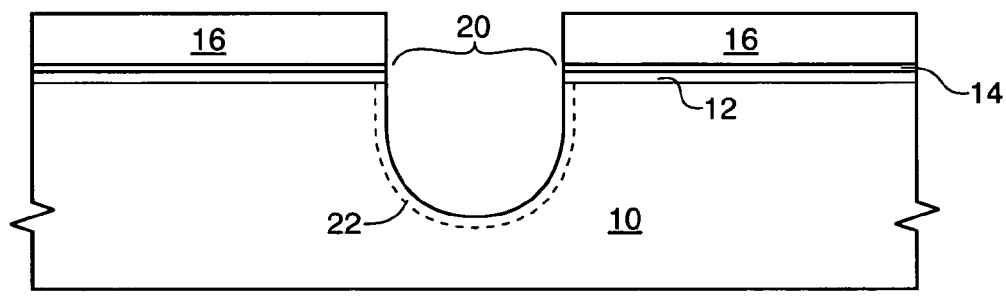
Figure 3:
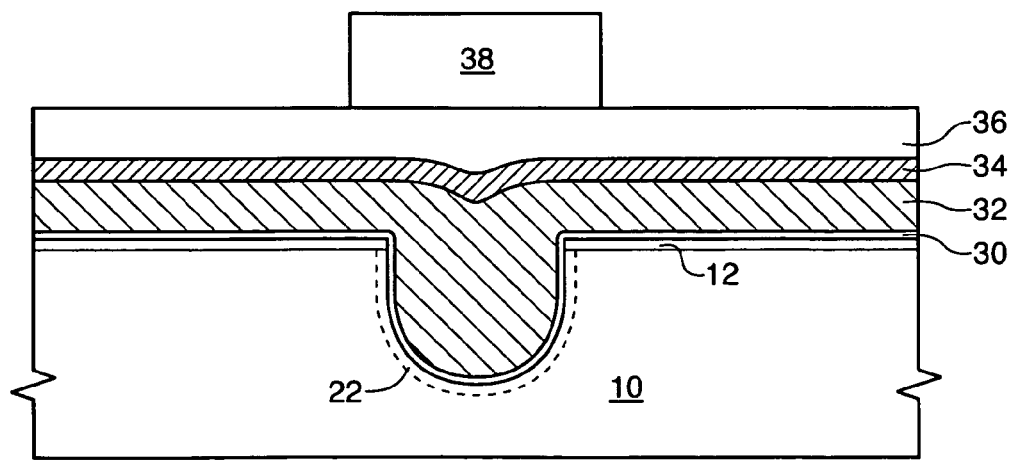
Figure 4:
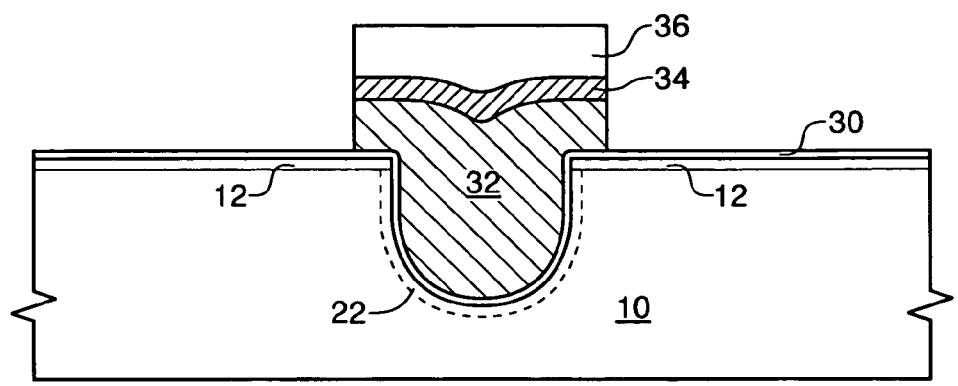
Figure 5:
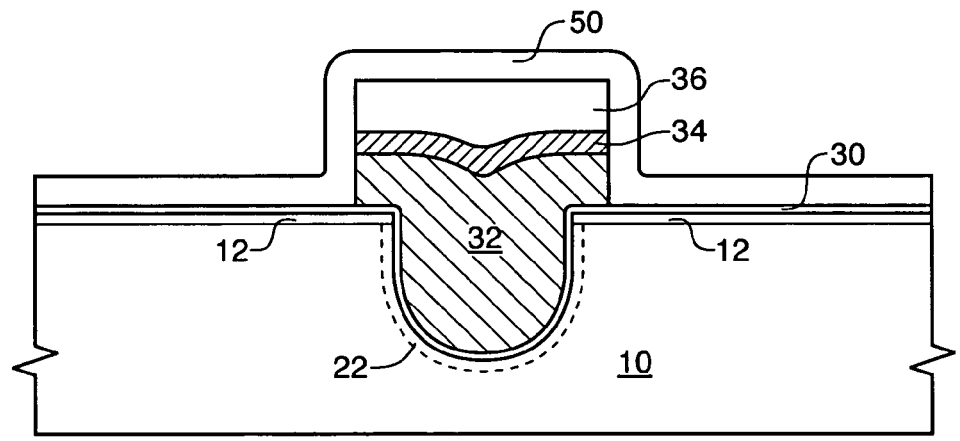
Figure 6:
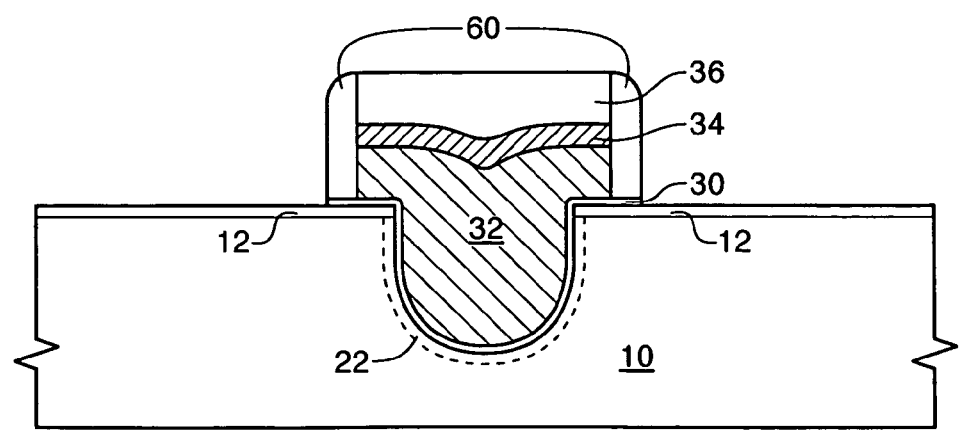
Figure 7:
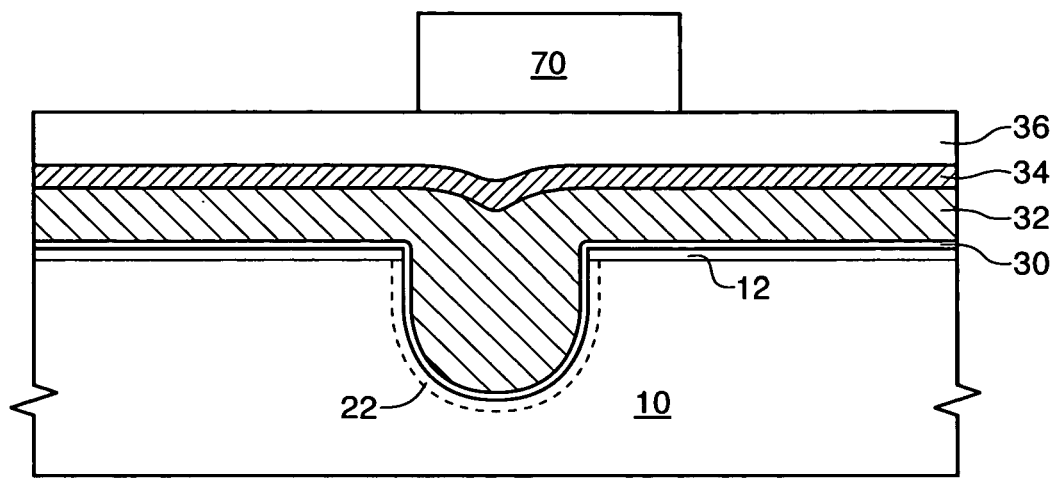
FIGS. 7-10 are cross sections depicting the conventional formation of a RAD transistor, wherein a misaligned mask is used to pattern the transistor gate stack.
Figure 8:
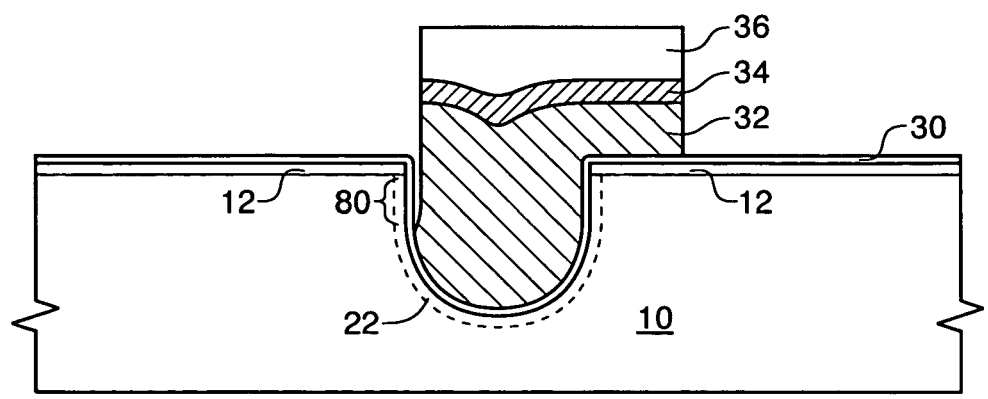
Figure 9:
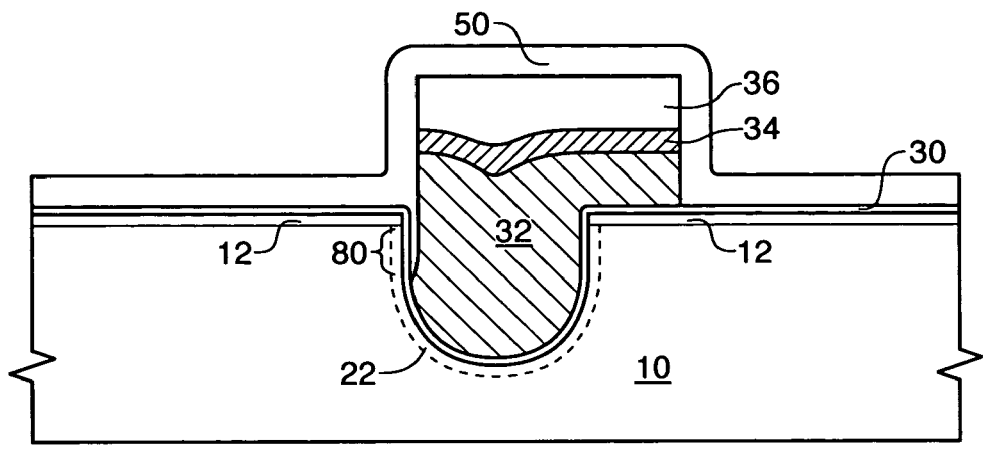
Figure 10:
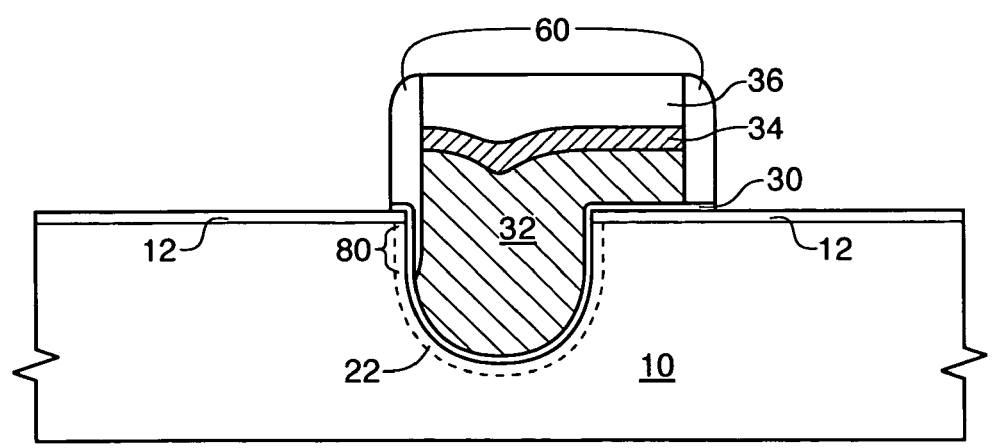

By comparing FIG. 16 with FIG. 10, it may be easily determined that the inventive process results in a complete fill of the trench with the polysilicon layer 32, even in the case where the mask which defines the transistor gate stack is inadvertently misaligned to such an extent that one of the vertical edges of the mask overlies the trench. In contrast, conventional processing as depicted in FIG. 10 results in removal of a portion of the polysilicon layer 32 from the trench. This removal exposes the channel region 22 and also results in the formation of the dielectric spacer material 60 within the trench 20 in the wafer 10. When the channel 22 is exposed during conventional processing with a misaligned mask, the missing portion of the gate electrode results in decreased electrical interaction between the gate and the channel. This decreased interaction may result in a higher threshold voltage for the transistor, and may prevent the transistor from activating during the application of $V_t$. The etch of the gate polysilicon 32 and subsequent formation of the dielectric layer 60 within the trench 20 as depicted in FIG. 10 effectively results in a thicker gate oxide at this location because the distance from the polysilicon layer 32 to the channel 22 is increased. This results in decreased electrical interaction between the gate layer 32 and the channel 22 at this location. This problem with conventional processing may be overcome by the present invention, as may be determined by reviewing the FIG. 16 structure which has been formed using an embodiment of the present invention with a misaligned mask.

The FIG. 16 structure comprises a recess 20 in the semiconductor wafer 10, with the recess filled with a transistor gate conductor 32 which, in the present embodiment, is doped polysilicon. A silicide layer 34 overlies the gate conductor 32, and a capping layer 36 overlies the silicide 34. FIG. 16 further depicts first and second cross sectional spacers 60 which, in the present embodiment, may comprise silicon nitride. Interposed between each spacer 60 and the wafer 10 is a portion of the vertical spacing layer 110 and the pad oxide 14.

The FIG. 16 structure also comprises, at the right-hand side of the transistor, an unetched portion 140 of the vertical spacing layer 110 which is interposed between the transistor gate conductor 32 and the semiconductor wafer 10. Further, a portion of the pad oxide 14 is interposed between unetched portion 140 of the vertical spacing layer 110 and the semiconductor wafer 10. As depicted, the left-hand side of the transistor does not comprise an unetched portion of the vertical spacing layer 110, but instead comprises only an etched portion of the vertical spacing layer. Both an etched portion of the vertical spacing layer and a portion of the pad oxide are interposed between the dielectric spacer 60 and the wafer 10 on the left-hand side of the FIG. 16 transistor.

On the left half of the misaligned transistor as depicted in FIG. 16, a vertically oriented edge of the polysilicon gate layer 32 overlies the trench, whereas on the depicted right half of the transistor the vertically oriented edge of the polysilicon gate layer 32 does not overlie the trench. The vertically oriented left edge extends below a horizontal upper surface (but does not extend below a horizontal lower surface) of the unetched portion 140 of layer 110, and thus does not extend into the trench formed in the wafer. As also depicted in FIG. 16, after etching the spacer layer 50 of FIG. 15 to complete the transistor and surrounding dielectric, a portion of the vertical spacing layer 110 on each side of the gate is exposed, as is a portion of the pad oxide layer 14.

Figure 17:
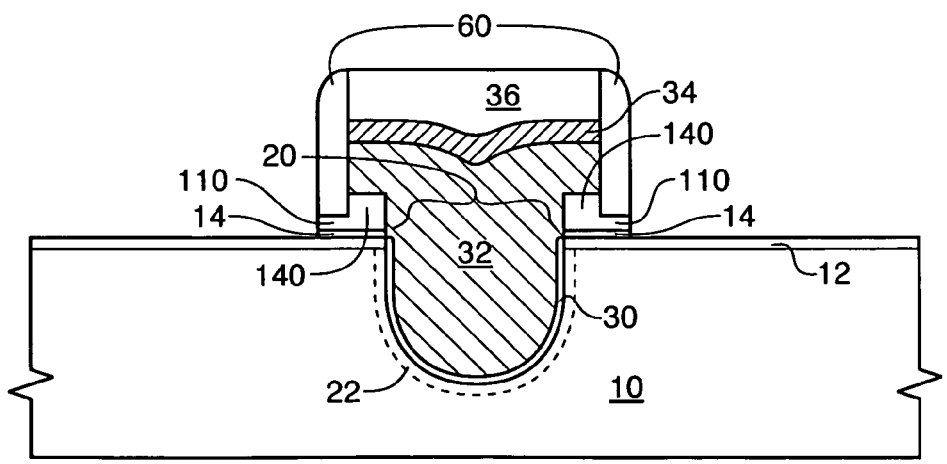
FIG. 17 is a cross section of an embodiment of the present invention used to form a RAD transistor, wherein a properly aligned mask is used to pattern the transistor gate stack.

FIG. 17 depicts an embodiment of the invention wherein a properly aligned mask has been used to define the transistor gate stack. As depicted, an unetched portion 140 of the vertical spacing layer 110 remains interposed between the trench in the wafer 10 and each of the vertically oriented sidewalls of the transistor gate stack at an oblique angle. These unetched segments 140 of the vertical spacing layer 110 are also interposed in a vertical direction between conductive transistor gate layer 32 and the semiconductor wafer 10 at a location on both sides of the trench. Further, transistor gate 32 is interposed between the two segments of layer 140 in this embodiment. Because the mask is properly aligned, neither of the cross sectional sidewalls in the mask which forms the transistor gate stack overlies the trench.

Figure 18:
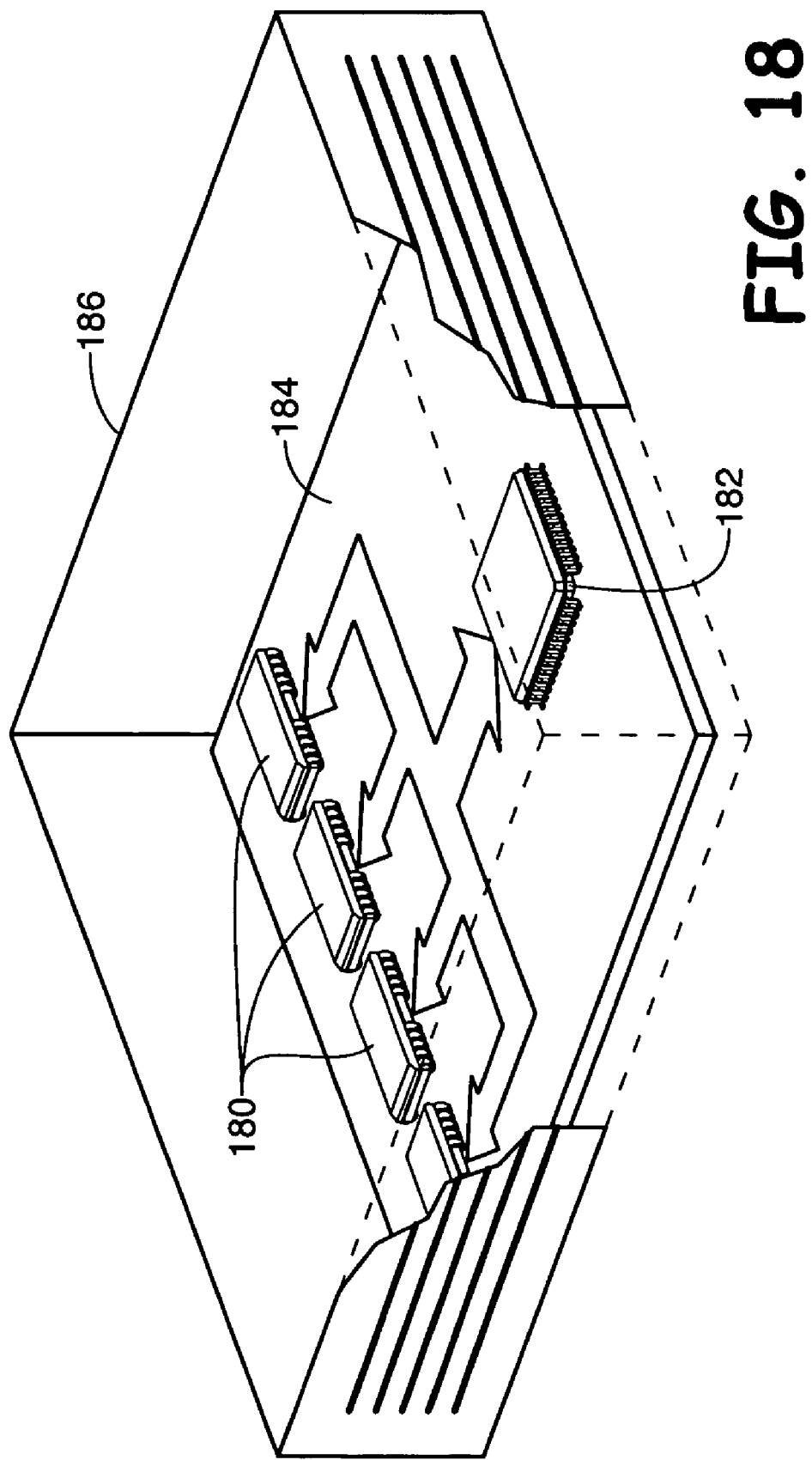
FIG. 18 is an isometric depiction of various components which may be manufactured using devices formed with an embodiment of the present invention.

As depicted in FIG. 18, a semiconductor device 180 formed in accordance with the invention may be attached along with other devices such as a microprocessor 182 to a printed circuit board 184, for example to a computer motherboard or as a part of a memory module used in a personal computer, a minicomputer, or a mainframe 186. FIG. 18 may also represent use of device 180 in other electronic devices comprising a housing 186, for example devices comprising a microprocessor 182, related to telecommunications, the automobile industry, semiconductor test and manufacturing equipment, consumer electronics, or virtually any piece of consumer or industrial electronic equipment.

Figure 19:
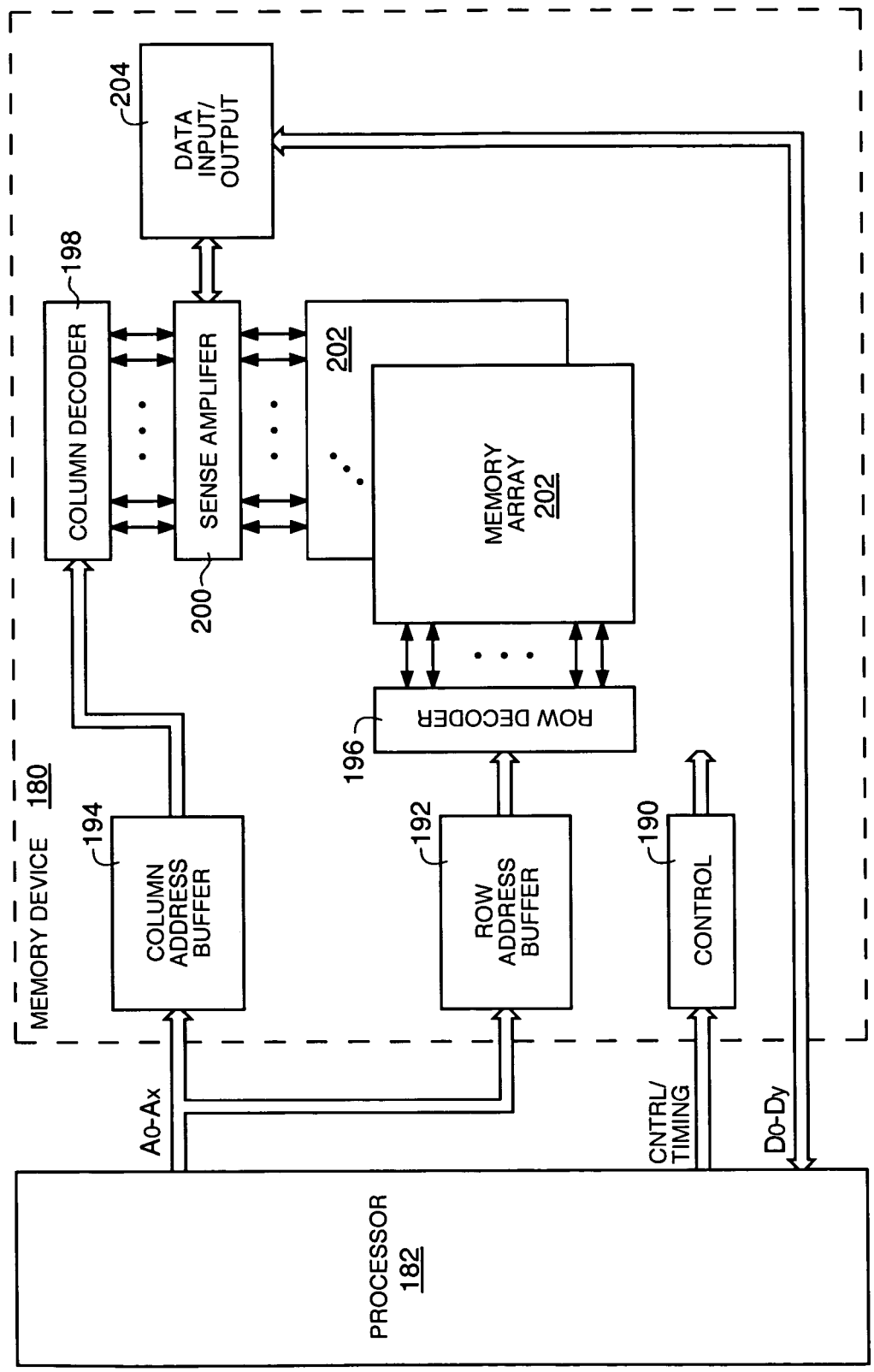
FIG. 19 is a block diagram of an exemplary use of the invention to form part of a memory device having a storage transistor array.

The process described herein can be used to manufacture a semiconductor device comprising one or more types of memory array transistors and/or periphery transistors formed using the inventive process. FIG. 19, for example, is a simplified block diagram of a memory device such as a dynamic random access memory having word lines formed using an embodiment of the present invention. The general operation of such a device is known to one skilled in the art. FIG. 19 depicts a processor 182 coupled to a memory device 180, and further depicts the following basic sections of a memory integrated circuit: control circuitry 190; row 192 and column 194 address buffers; row 196 and column 198 decoders; sense amplifiers 200; memory array 202; and data input/output 204.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for use in fabrication of a semiconductor device, comprising:
   forming a dielectric vertical spacing layer over a semiconductor wafer;
   etching the dielectric vertical spacing layer and the semiconductor wafer to form a trench in the semiconductor wafer;
   forming a gate oxide layer within the trench over a surface of the semiconductor wafer;
   forming a conductive transistor gate layer on the gate oxide layer and over the vertical spacing layer;
   etching the conductive transistor gate layer to at least expose the dielectric vertical spacing layer, to pattern the conductive transistor gate layer, and to form first and second vertically oriented sidewalls from the conductive transistor gate layer;
   forming a dielectric spacer layer on the first and second vertically oriented sidewalls of the conductive transistor gate layer and over a horizontally oriented surface of the vertical spacing layer; and
   etching the dielectric spacer layer and the dielectric vertical spacing layer to form a first spacer along the first vertically oriented sidewall of the conductive transistor gate layer and a second spacer along the second vertically oriented sidewall of the conductive transistor gate layer wherein a vertical surface of the dielectric vertical spacing layer remains exposed.

2. The method of claim 1 further comprising, during the etching of the conductive transistor gate layer to pattern the conductive transistor gate layer, forming the first vertically oriented sidewall of the conductive transistor gate layer directly over the trench.

3. The method of claim 2 further comprising, during the etching of the conductive transistor gate layer to pattern the conductive transistor gate layer, forming the second vertically oriented sidewall directly over a wafer region which does not comprise the trench.

4. The method of claim 2 further comprising forming a portion of the first spacer directly over the trench.

5. The method of claim 2 further comprising, during formation of the first and second spacers; leaving unetched a portion of the dielectric vertical spacing layer which is obliquely interposed between the trench and the second sidewall, while etching completely through a portion of the dielectric vertical spacing layer obliquely interposed between the trench and the first sidewall.

6. The method of claim 5 further comprising angle implanting a dopant into the semiconductor wafer at a wafer location directly under the unetched portion of the dielectric vertical spacing layer.

7. The method of claim 1 further comprising leaving unetched a first portion of the dielectric vertical spacing layer which is interposed between the trench and the first sidewall, and leaving unetched a second portion of the dielectric vertical spacing layer which is interposed between the trench and the second sidewall.

8. The method of claim 1 further comprising:
   forming a pad dielectric layer on the semiconductor wafer;
   forming the dielectric vertical spacing layer on the pad dielectric layer; and
   during the etch of the dielectric vertical spacing layer and the semiconductor wafer to form the trench in the semiconductor wafer, etching the pad dielectric layer.

9. A method used in fabrication of a semiconductor device, the method comprising:
   forming a dielectric vertical spacing layer over a semiconductor wafer;
   forming a patterned first mask over the dielectric vertical spacing layer;
   etching the dielectric vertical spacing layer and the semiconductor wafer using the first mask as a pattern, wherein the etch of the semiconductor wafer forms a recess in the semiconductor wafer;
   forming a blanket conductive transistor gate layer within the recess and over the dielectric vertical spacing layer;
   forming a patterned second mask over the blanket conductive transistor gate layer and over the recess;
   etching the blanket conductive transistor gate layer using the second mask as a pattern, wherein the dielectric vertical spacing layer is at least exposed during the etching of the blanket conductive transistor gate layer;
   forming a spacer layer over the etched conductive transistor gate layer and over the dielectric vertical spacing layer; and
   anisotropically etching the spacer layer and the dielectric vertical spacing layer, wherein subsequent to anisotropically etching the dielectric vertical spacing layer a portion of the dielectric vertical spacing layer is interposed between the semiconductor wafer and the etched conductive transistor gate layer.

10. The method of claim 9 further comprising forming first and second cross sectional second mask sidewalls during the formation of the second mask, wherein one of the sidewalls overlies the recess in the wafer.

11. The method of claim 10 further comprising etching a portion of the blanket conductive transistor gate layer which is directly over the recess during the etching of the blanket conductive transistor gate layer.

12. The method of claim 10 further comprising leaving a portion of the dielectric vertical spacing layer unetched during the etching of the dielectric vertical spacing layer, wherein a portion of the unetched portion of the dielectric vertical spacing layer is interposed between the conductive transistor gate and the semiconductor wafer on only one side of the recess in the wafer in a direction perpendicular to a major surface of the semiconductor wafer.

13. The method of claim 9 further comprising:
   forming first and second cross sectional second mask sidewalls during the formation of the second mask, wherein neither the first nor second cross sectional second mask sidewalls overlies the recess in the wafer; and
   leaving a portion of the dielectric vertical spacing layer unetched during the etching of the dielectric vertical spacing layer, wherein a portion of the unetched dielectric vertical spacing layer is interposed between the conductive transistor gate and the semiconductor wafer on each side of the recess in the wafer in a direction perpendicular to a major surface of the semiconductor wafer.

14. A method used in fabrication of a semiconductor device, comprising:
   forming a dielectric vertical spacing layer over a semiconductor wafer substrate assembly;
   etching the semiconductor wafer substrate assembly to form a void therein;

forming a conductive transistor gate layer within the void and over the dielectric vertical spacing layer;

forming a patterned mask over the conductive transistor gate layer and over the dielectric vertical spacing layer; and etching the conductive transistor gate layer to expose a first portion of the dielectric vertical spacing layer, wherein a second portion of the dielectric vertical spacing layer interposed between the semiconductor wafer substrate assembly and the etched conductive transistor gate layer remains unetched.

15. The method of claim 14 further comprising forming a gate dielectric layer within the void in the semiconductor wafer substrate assembly subsequent to forming the dielectric vertical spacing layer.

16. The method of claim 14 further comprising etching only partially through a thickness of the dielectric vertical spacing layer during the etching of the conductive transistor gate layer.

17. The method of claim 14 further comprising angle doping the semiconductor wafer substrate assembly at a location directly under the second portion of the dielectric vertical spacing layer.

18. The method of claim 14 further comprising:

forming the patterned mask to comprise first and second vertically oriented sidewalls, wherein in a cross section neither the first nor the second vertically oriented sidewall overlies the void in the semiconductor wafer substrate assembly; and etching the conductive transistor gate layer such that a second, unetched portion of the dielectric vertical spacing layer remains on either side of the void in the semiconductor wafer substrate assembly at the cross section.

19. The method of claim 14 further comprising:

forming the patterned mask to comprise first and second vertically oriented sidewalls, wherein in a cross section the first vertically oriented sidewall overlies the void in the semiconductor wafer substrate assembly and the second vertically oriented sidewall does not overlie the void in the semiconductor wafer substrate assembly; and etching the conductive transistor gate layer such that the second portion of the dielectric vertical spacing layer remains only on the side of the void which comprises the second sidewall.

20. The method of claim 19 further comprising angle doping the semiconductor wafer substrate assembly at a location directly under the second portion of the dielectric vertical spacing layer.

21. A method for forming an electronic device, comprising:

forming at least one semiconductor device using a method comprising:

forming a dielectric vertical spacing layer over a semiconductor wafer substrate assembly;

etching the semiconductor wafer substrate assembly to form a void therein;

forming a conductive transistor gate layer within the void and over the dielectric vertical spacing layer;

forming a patterned mask over the conductive transistor gate layer and over the dielectric vertical spacing layer; and etching the conductive transistor gate layer to expose a first portion of the dielectric vertical spacing layer, wherein a second portion of the dielectric vertical spacing layer interposed between the semiconductor wafer substrate assembly and the etched conductive transistor gate layer remains unetched;

providing at least one microprocessor; and electrically coupling the at least one semiconductor device and the at least one microprocessor to enable the passage of electrical signals therebetween.

\* \* \* \* \*